United States Patent
Echigo

(10) Patent No.: US 11,693,309 B2
(45) Date of Patent: Jul. 4, 2023

(54) IMPRINT APPARATUS, IMPRINT METHOD, AND METHOD FOR MANUFACTURING ARTICLE

(71) Applicant: CANON KABUSHIKI KAISHA, Tokyo (JP)

(72) Inventor: Hiroki Echigo, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 204 days.

(21) Appl. No.: 16/395,863

(22) Filed: Apr. 26, 2019

(65) Prior Publication Data

US 2019/0354007 A1 Nov. 21, 2019

(30) Foreign Application Priority Data

May 15, 2018 (JP) .................................. 2018-093966

(51) Int. Cl.
*G03F 7/00* (2006.01)
(52) U.S. Cl.
CPC .................................. *G03F 7/0002* (2013.01)
(58) Field of Classification Search
CPC .................... G03F 7/0002; G05B 2219/45028
See application file for complete search history.

(56) References Cited

U.S. PATENT DOCUMENTS

| 10,871,709 B2 | 12/2020 | Sakai |
| 2011/0159189 A1* | 6/2011 | Ito ........................ B82Y 40/00 118/668 |
| 2011/0262652 A1 | 10/2011 | Dokai |
| 2016/0039126 A1* | 2/2016 | Tan ......................... B29C 43/58 264/40.5 |

(Continued)

FOREIGN PATENT DOCUMENTS

| JP | 2004165199 A | 6/2004 |
| JP | 2012004463 A * | 1/2012 |

(Continued)

OTHER PUBLICATIONS

Office Action issued in Japanese Appln. No. 2018-093966 dated Feb. 8, 2022.

(Continued)

*Primary Examiner* — Michael M. Robinson
*Assistant Examiner* — Victoria Bartlett
(74) *Attorney, Agent, or Firm* — Rossi, Kimms & McDowell LLP

(57) ABSTRACT

Provided is an imprint apparatus advantageous in terms of throughput. An imprint apparatus which brings an imprint material on a mold substrate into contact with a mold and forms a pattern made of the imprint material includes: a mold holding unit which holds the mold; a substrate holding unit which holds the substrate; a detecting unit which detects the occurrence of abnormality in a holding operation in the mold holding unit or the substrate holding unit and a position of the mold or the substrate; and a controller which performs at least one of the determination concerning whether or not a return process in which a state is returned from a state in which the abnormality of the holding operation has occurred to a normal state is possible and the execution of the return process on the basis of a result of the detection of the detecting unit.

18 Claims, 6 Drawing Sheets

(56) References Cited

U.S. PATENT DOCUMENTS

2016/0052179 A1    2/2016  Murayama

FOREIGN PATENT DOCUMENTS

| | | | |
|---|---|---|---|
| JP | 2015115370 A | | 6/2015 |
| JP | 2016170287 A | * | 9/2016 |
| JP | 2018010942 A | | 1/2018 |
| JP | 2018011051 A | | 1/2018 |
| KR | 10-2011-0119538 A | | 11/2011 |

OTHER PUBLICATIONS

Notice of Preliminary Rejection issued in Korean Patent Application No. 10-2019-0056020 dated Aug. 22, 2022. English translation provided.

* cited by examiner

IMPRINT APPARATUS, IMPRINT METHOD, AND METHOD FOR MANUFACTURING ARTICLE

BACKGROUND OF THE INVENTION

Field of the Invention

The present invention relates to an imprint apparatus, an imprint method, and a method for manufacturing an article.

Description of the Related Art

There are imprint techniques for bringing a mold into contact with an imprint material on a substrate and forming a fine pattern. One of imprint techniques is a photocuring method using a photocurable resin as an imprint material. In imprint apparatuses having this photocuring method adopted thereto, an imprint material supplied to a shot region on a substrate is irradiated with light and the imprint material is cured in a state in which the imprint material is brought into contact with a mold. Moreover, a pattern made of the imprint material is formed on the substrate by separating the mold from the cured imprint material.

When separating (releasing) such a mold, a large stress is instantaneously applied to an interface between the mold and the imprint material (surfaces in which the mold and the imprint material are in contact with each other). Due to such stress, the mold may not be able to be released normally from the imprint material, and the mold and the substrate may not be able to be held by the respective holding parts (chucks) or the mold and the substrate may be detached from the respective holding parts.

In the imprint apparatus described in Japanese Patent Laid-Open No. 2015-115370, a value (a current value) of a drive current applied to a mold stage is detected (monitored) by a current detector and whether or not the mold has been released from the cured resin on the substrate is detected. Moreover, when it is determined that the mold has not been released from the cured resin on the substrate, a force by which the substrate is held by the substrate stage is made larger than a predetermined holding force and the mold is released from the cured resin on the substrate.

However, in a case in which the mold or the substrate is detached from respective holding parts, there is a concern concerning the mold or the substrate being damaged in accordance with such a state when a holding force of the substrate stage is larger than a predetermined holding force. Thus, under such circumstances, there is no choice but to stop the device and restore the state of the device to a normal state manually. In the case of manual return, the operation of the device has to be stopped and the throughput may be reduced. Furthermore, in the case of manual restoration, a degree of cleanness inside the device may be reduced in some cases. Moreover, since it may take a long time for the cleanness of the inside of the device to stabilize and the operation of the device to be able to be resumed, the throughput may be reduced.

SUMMARY OF THE INVENTION

An objective of the present invention is to provide, for example, an imprint apparatus advantageous in terms of throughput.

The present invention is an imprint apparatus which brings an imprint material on a substrate into contact with a mold and forms a pattern made of the imprint material including: a mold holding unit which holds the mold; a substrate holding unit which holds the substrate; a detecting unit which detects the occurrence of abnormality in a holding operation in the mold holding unit or the substrate holding unit and a position of the mold or the substrate; and a controller which performs at least one of determination concerning whether or not a restoration process in which a state is restored from a state in which an abnormality in the holding operation has occurred to a normal state is possible and execution of the return process on the basis of a result of the detection of the detecting unit.

Further features of the present invention will become apparent from the following description of exemplary embodiments with reference to the attached drawings.

DESCRIPTION OF THE EMBODIMENTS

An aspect for realizing the present invention will be described below with reference to the drawings and the like.

First Embodiment

Figure 1:
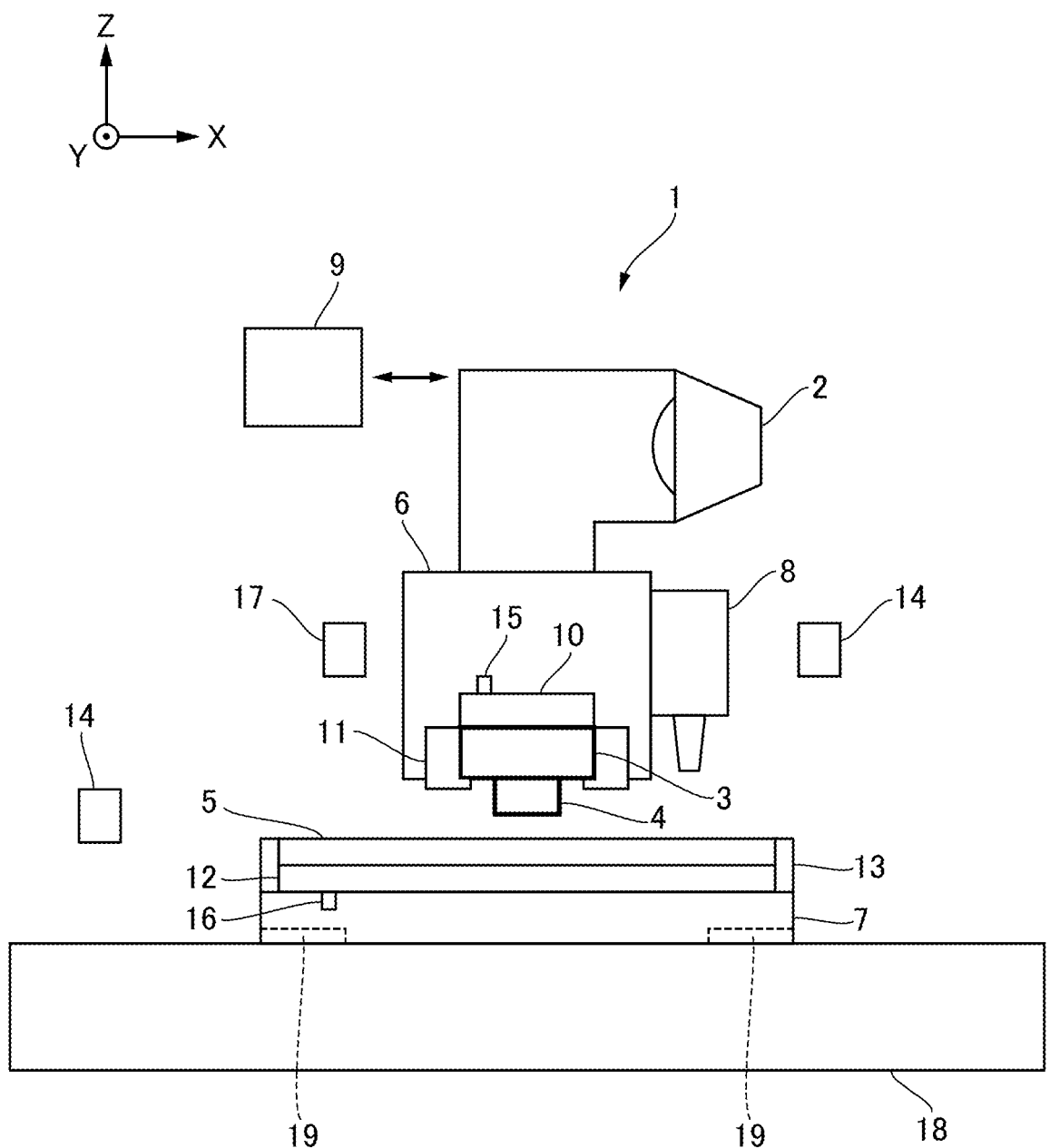
FIG. 1 is a schematic diagram illustrating a configuration of an imprint apparatus as an aspect of the present invention.

FIG. 1 is a schematic diagram illustrating a configuration of an imprint apparatus 1 as an aspect of the present invention. The imprint apparatus 1 is a lithography apparatus in which a pattern formed of an imprint material is formed on a substrate using a mold. In an embodiment, the imprint apparatus 1 brings the imprint material supplied onto the substrate into contact with the mold, applies curing energy to the imprint material, and forms a pattern formed of a cured material having a concave and convex pattern of the mold transferred thereon.

A curable composition (referred to as an uncured resin in some cases) cured by applying curing energy is used for the imprint material. Examples of the curing energy include electromagnetic waves, heat, and the like. Examples of the electromagnetic waves include light such as infrared rays, visible rays, and ultraviolet rays selected from a wavelength range of 10 nm or more and 1 mm or less.

The curable composition is a composition cured by irradiation of light or by heating. A photocurable composition cured by irradiation of light may contain at least a polymerizable compound and a photopolymerization initiator and may contain non-polymerizable compounds or a solvent if necessary. The non-polymerizable compounds are at least one selected from the group consisting of a sensitizer, a hydrogen donor, an internal additive type releasing agent, a surfactant, an antioxidant, a polymer compound, and the like.

The imprint material may be applied in a film form onto the substrate by a spin coater or a slit coater. Furthermore, the imprint material may be applied onto the substrate in a droplet form or in the form of islands or films formed by connecting a plurality of droplets using a liquid ejecting head. The viscosity (viscosity at 25° C.) of the imprint material is, for example, 1 mPa·s or more and 100 mPa·s or less.

The imprint apparatus 1 includes an imprint head 6 which moves while holding a mold 3, a substrate stage 7 which moves while holding a substrate 5, a curing unit 2, a supplying unit 8, an alignment measurement unit 17, a detecting unit 14, and a controller 9. It should be noted that, in FIG. 1, directions are illustrated in an XYZ coordinate system in which directions parallel to a surface of the substrate are defined as an XY plane. Directions parallel to an X axis, a Y axis, and a Z axis in the XYZ coordinate system are defined as an X direction, a Y direction, and a Z direction and rotation around the X axis, rotation around the Y axis, and rotation around the Z axis are defined as θX, θY, and θZ, respectively.

The mold 3 has a mesa 4 whose outer circumferential portion is rectangular and which is formed as a convex portion of several tens of μm to several hundreds of μm at a center portion thereof facing the substrate 5. The mesa 4 has a pattern portion in which a concave and convex pattern to be transferred to an imprint material supplied onto the substrate is three-dimensionally formed. A pattern portion of the mold 3 is transferred to an imprint material applied above the substrate 5. Examples of a material for the mold 3 include a material through which ultraviolet rays are transmitted such as quartz. The mold 3 is moved while held by the imprint head 6.

The imprint head 6 includes a mold chuck 10 and a mold holding force measuring unit 15. The imprint head 6 can be driven in the Z direction using, for example, an actuator such as a linear motor and an air cylinder. The imprint head 6 may be configured to be driven with respect to a plurality of axes (for example, three axes, that is, the Z axis, a θX axis, and a θY axis). Furthermore, the imprint head 6 may include a plurality of drive systems such as a coarse drive system and a fine drive system to realize highly accurate positioning of the mold 3. In addition, the imprint head 6 may have a function of driving the mold 3 not only in the Z direction but also in the X direction, the Y direction, and a θZ direction and a function of correcting the inclination of the mold 3. The imprint head 6 can also correct a shape of the pattern portion of the mold 3 in accordance with a shape of a shot region of the substrate 5 using a pressurization finger 11 or the like disposed around the mold 3. The pressurization finger 11 is a contact member which comes into contact with a lateral surface of the mold 3. The mold chuck 10 is a mold holding unit which holds the mold 3 using a vacuum suction force, an electrostatic force, or the like. The mold chuck 10 is placed on the imprint head 6. The mold holding force measuring unit 15 measures a force by which the mold 3 is held by the mold chuck 10, for example, by measuring a suction pressure or a current value of the mold chuck 10. The mold holding force measuring unit 15 can also function as a detecting unit which detects a current position of the mold 3 and detects the occurrence of desorption of the mold 3 in the mold chuck 10.

The substrate 5 may be a member made of glass, a ceramic, a metal, a semiconductor, a resin, or the like. A layer made of a material different from the member may be formed on a surface of the member if necessary. The substrate 5 is, for example, a silicon wafer, a compound semiconductor wafer, a quartz glass plate, or the like. The substrate 5 is moved while held by the substrate stage 7.

The substrate stage 7 includes a substrate chuck 12 and a substrate holding force measuring unit 16. The substrate stage 7 includes an air guide 19 and a drive mechanism (not shown). The air guide 19 ejects a gas to a surface of a base surface plate 18 facing the substrate stage 7 and supports the substrate stage 7 by forming a gap between the substrate stage 7 and the base surface plate 18. The drive mechanism is, for example, an actuator such as a linear motor and an air cylinder, which drives the substrate stage 7 in the X axis direction and the Y axis direction. The drive mechanism may be configured to drive the substrate stage 7 with respect to a plurality of axes (for example, three axes, i.e., the X axis, the Y axis, a θZ axis, preferably, six axes, i.e., the X axis, the Y axis, the Z axis, a θX axis, a θY axis, and the θZ axis). Furthermore, the substrate stage 7 may include a plurality of drive systems such as a coarse drive system and a fine drive system. The substrate stage 7 may have a function of driving the substrate 5 in the Z axis direction or the θ (the rotation around the Z axis) direction and a function of correcting the inclination of the substrate 5.

The substrate chuck 12 is a substrate holding unit which holds the substrate 5 using a vacuum suction force, an electrostatic force, or the like. The substrate chuck 12 is placed on the substrate stage 7. A protective plate (a flush plate 13) surrounding the substrate 5 is disposed on an outer circumference of the substrate chuck 12. The flush plate 13 is disposed on the substrate stage 7 to reduce the positional deviation of the substrate 5 when holding the substrate 5 on the substrate chuck 12. When the substrate chuck 12 holds the substrate 5, the flush plate 13 and the substrate 5 have the same height. The substrate holding force measuring unit 16 measures a holding force of the substrate 5 by the substrate chuck 12, for example, by measuring a suction pressure or an electrical power value of the substrate chuck 12. The substrate holding force measuring unit 16 can also function as a detecting unit which detects a current position of the substrate 5 and the occurrence of desorption of the substrate 5 in the substrate chuck 12.

The curing unit 2 supplies energy (for example, light such as ultraviolet rays) for curing an imprint material on the substrate 5. A pattern conforming to a concave and convex pattern of the mold 3 is formed on the imprint material on the substrate 5 after releasing the mold 3 using energy supplied by the curing unit 2.

The supplying unit 8 supplies (applies) an imprint material onto a substrate. The alignment measurement unit 17 can include, for example, a measurement light source such as a He—Ne laser configured to emit light having a wavelength which does not cure an imprint material on a substrate and a detector such as a CCD image sensor. The alignment measurement unit 17 is used for aligning the mold 3 and the substrate 5. The alignment measurement unit 17 may be used as a detecting unit which detects current positions of the mold 3 and the substrate 5 and detects the occurrence of desorption of the mold 3 or the substrate 5 in the mold chuck 10 or the substrate chuck 12. The detecting unit 14 is a detecting unit which detects current positions of the mold 3 and the substrate 5 and detects the occurrence of desorption of the mold 3 or the substrate 5 in the mold chuck 10 or the substrate chuck 12. For example, the detecting unit 14 may be a measuring instrument which measures a holding force of the mold chuck 10 or the substrate chuck 12 or a scope which allows observation of a holding state of the mold chuck 10 or the substrate chuck 12. Moreover, the detecting unit 14 may be a sensor such as a laser interferometer which detects a position of the mold 3 or the substrate 5.

The controller 9 includes a central processing unit (CPU), a memory, and the like and controls each unit of the imprint apparatus 1 to perform an imprint process. The imprint process includes a supplying process, a mold pressing process, a curing process, and a mold releasing process. Furthermore, the controller 9 determines whether or not a return process for returning from a state in which the abnormality of a holding operation has occurred to a normal state is possible on the basis of a result of the detection of the detecting unit 14 when the abnormality of the holding operation has occurred in the mold chuck 10 or the substrate chuck 12. Moreover, the controller 9 also selects the specific details of the return process on the basis of the result of the detection of the detecting unit 14. The controller 9 performs at least one of determining whether or not a return process is possible and executing a return process on the basis of the result of the detection of the detecting unit 14. The abnormality of the holding operation is typically detachment of the mold 3 from the mold chuck 10 or detachment of the substrate 5 from the substrate chuck 12.

Figure 2:
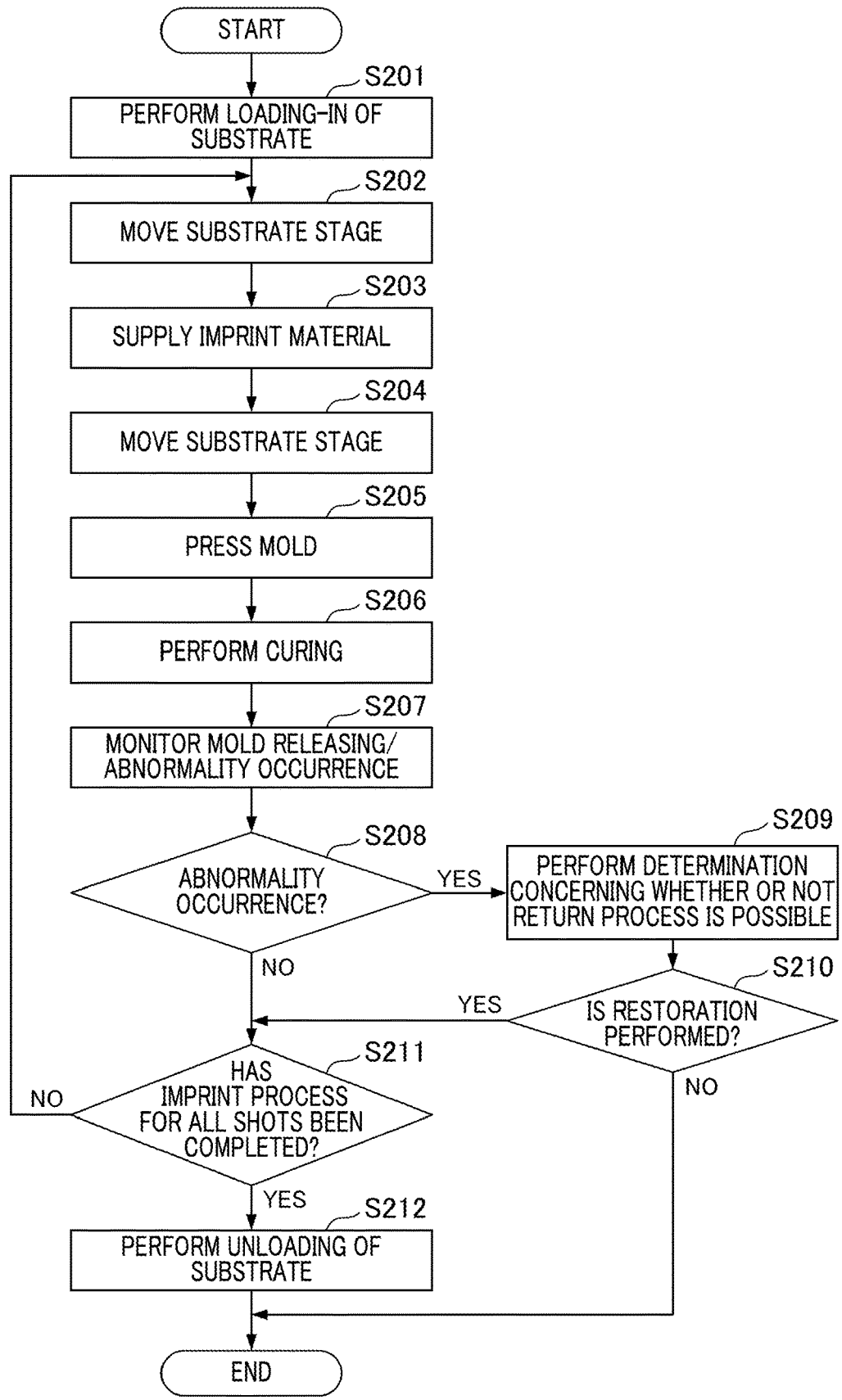
FIG. 2 is a flowchart for describing an imprint process according to an embodiment.

FIG. 2 is a flowchart for describing an imprint process according to the embodiment. Each step in this flowchart can be performed using the controller 9. In Step S201, the substrate 5 is loaded into the imprint apparatus 1 using a substrate conveyance unit (not shown) and held on the substrate stage 7. In Step S202, the substrate stage 7 is moved so that an imprint material is fed at a predetermined shot. In Step S203, the supplying unit 8 supplies an imprint material to a shot region formed on the substrate 5. In Step S204, the substrate stage 7 is moved so that the shot region having the imprint material supplied thereto is located immediately under the mold 3.

In Step S205, the mold 3 is brought into contact with the imprint material on the substrate (pressing the mold). By bringing the mold 3 into contact with the imprint material on the substrate, that is, pressing the mold 3 against the imprint material, the pattern portion of the mold 3 is filled with the imprint material. In Step S206, the imprint material is cured in a state in which the mold 3 is brought into contact with the imprint material on the substrate. In Step S207, the mold 3 is released from the cured imprint material on the substrate (releasing the mold). It should be noted that the pressing of the mold and the releasing of the mold may be performed by either or both of the imprint head 6 and the substrate stage 7. Here, when releasing of the mold is started, monitoring (abnormality occurrence monitoring) by the detecting unit is also started to perform determination concerning whether or not the abnormality of a holding operation has occurred in the mold chuck 10 or the substrate chuck 12. For example, the mold holding force measuring unit 15 and the substrate holding force measuring unit 16 which are detecting units may measure suction pressures of the mold chuck 10 and the substrate chuck 12 when the mold 3 and the substrate 5 are held through vacuum suction. From this, adsorption states of the mold chuck 10 and the substrate chuck 12 are monitored.

When the detecting unit detects that an adsorption state of the mold 3 or the substrate 5 is abnormal (Yes in Step S208), in Step S209, the controller 9 determines whether or not a return process is possible. The determination concerning whether or not the return process is possible will be described in detail below. Subsequently, it is determined whether or not restoration has been performed. When it is determined that the restoration has been performed (Yes in Step S210), in Step S211, the controller 9 determines whether or not the imprint process for all shots has been completed. When it is determined that the imprint process has been completed (Yes), in Step S212, the substrate 5 is loaded outside of the substrate stage 7 by controlling the substrate conveyance unit. When it is determined that the imprint process has not been completed (No), the processes of Step S202 and subsequent Steps are repeated. It should be noted that, when it is determined in Step S210 that the restoration has not been performed (No), the operation of the device may be stopped and the maintenance or the like may be performed. When the occurrence of abnormality in the holding operation is not detected in Step S208 (No), the process of Step S211 is performed.

Figure 3:
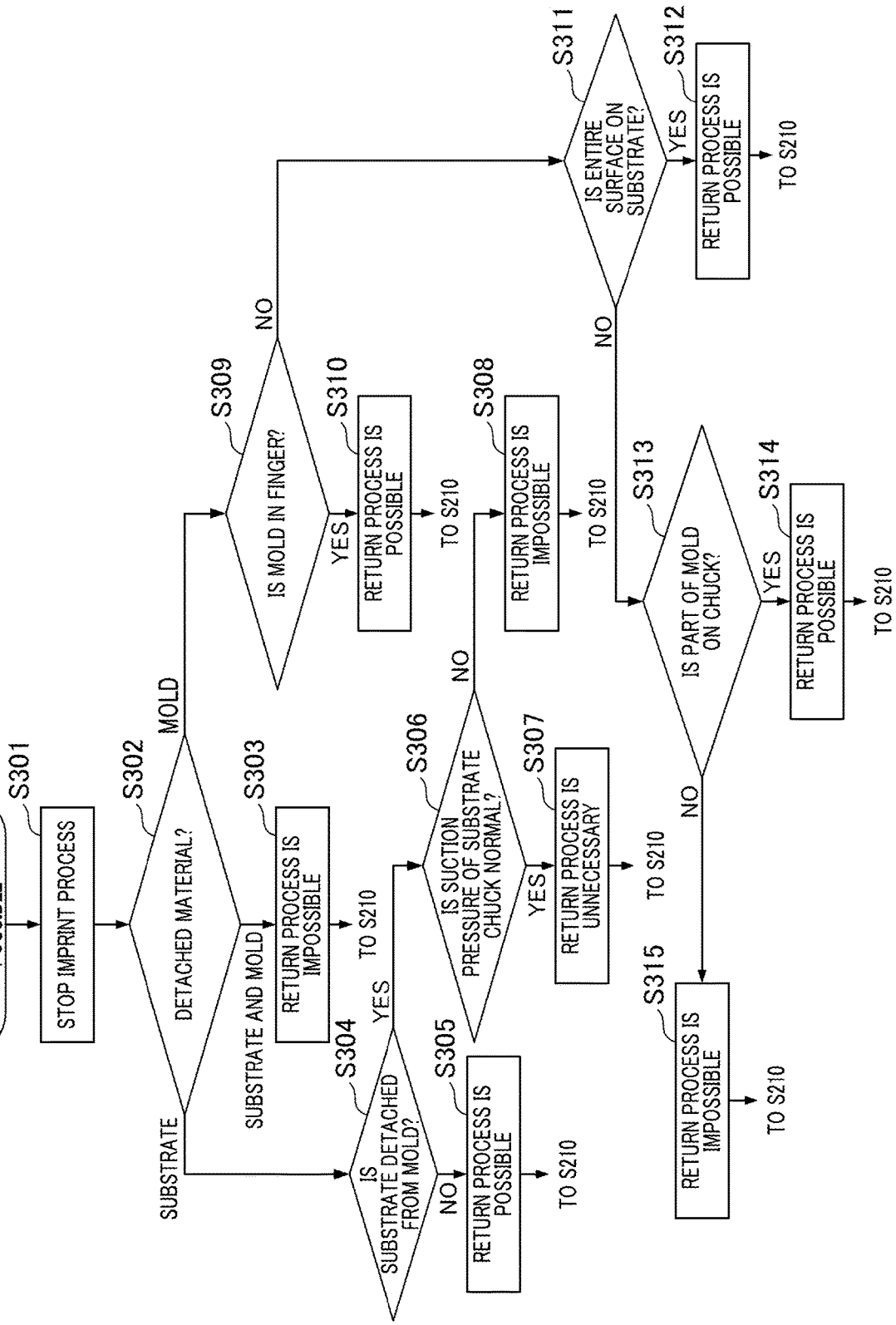
FIG. 3 is a flowchart for describing determination concerning whether or not a return process is possible according to the embodiment.

FIG. 3 is a flowchart for describing determination concerning whether or not a return process is possible according to the embodiment. Each step in this flowchart can be performed using the controller 9. It should be noted that, in this embodiment, for example, it is assumed that the mold chuck 10 and the substrate chuck 12 hold the mold 3 and the substrate 5 through vacuum suction. In the abnormality occurrence monitoring (Step S207 in FIG. 2), when the abnormality of the holding operation is detected, the imprint process is first stopped (Step S301). Subsequently, based on results of the measurement of the mold holding force measuring unit 15 and the substrate holding force measuring unit 16, it is determined whether or not a material detached from the chuck is either or both of the mold 3 and the substrate 5 by ascertaining adsorption states of the mold chuck 10 and the substrate chuck 12 (Step S302). It should be noted that, here, the chuck is a generic name for the mold chuck 10 and the substrate chuck 12 and the same applies to the following description.

Figure 4A:
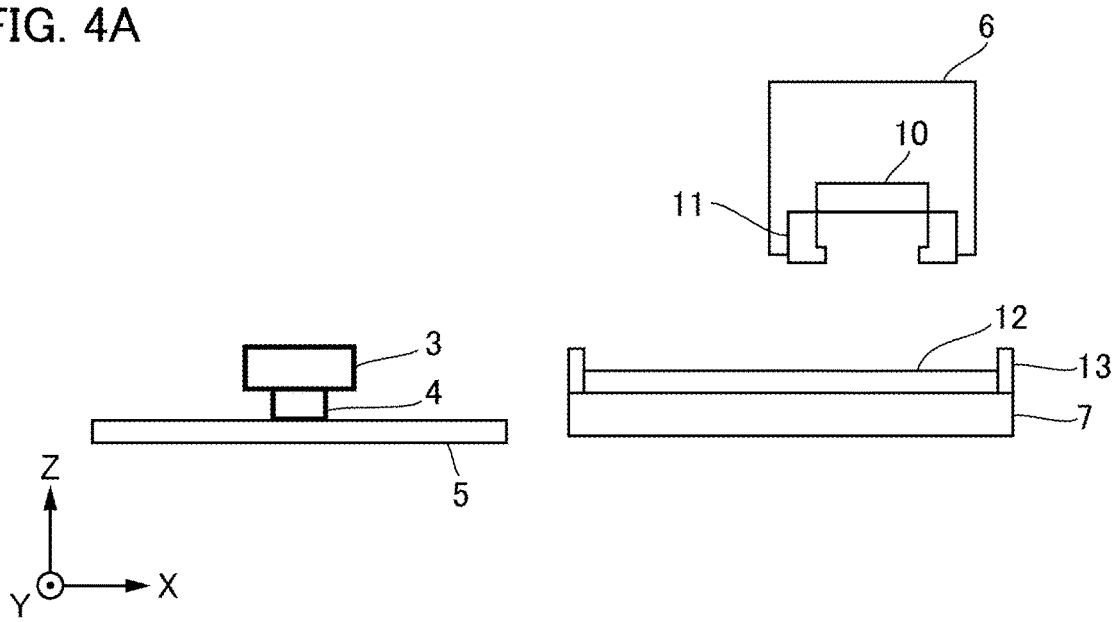
FIGS. 4A to 4C are diagrams for explaining an abnormality in a holding operation in which a restoration process is not possible.
Figure 4B:
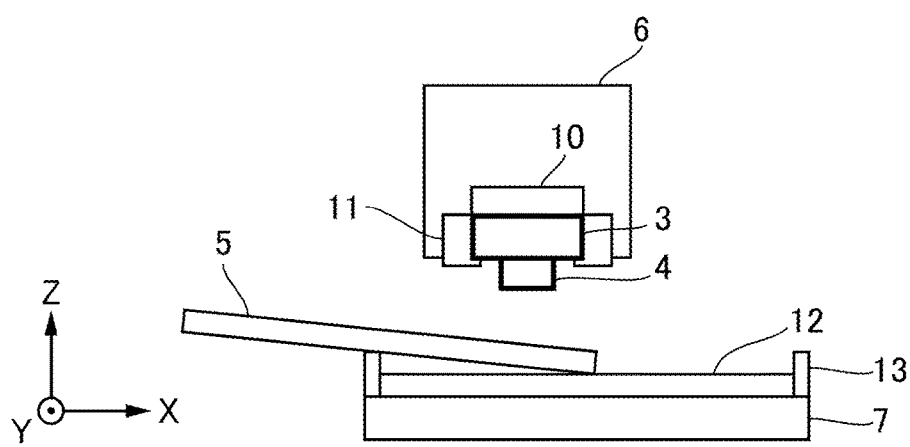
Figure 4C:
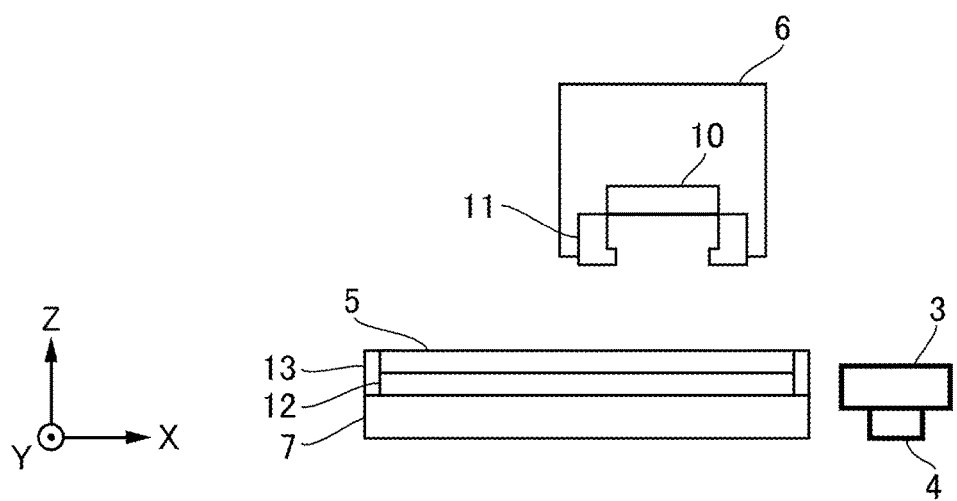

When it is determined that both of the mold 3 and the substrate 5 are detached from the chuck, the substrate 5 is likely to ride on the flush plate 13 or the substrate 5 and the mold 3 are likely to fall outside the substrate stage 7. FIGS. 4A to 4C are diagrams for explaining of an abnormality of a holding operation in which a return process is impossible. FIG. 4A illustrates an example of a state in which both of the mold 3 and the substrate 5 are detached from the chuck. In this state, since there is a concern concerning breakage of the mold 3 or the substrate 5 due to the return process, it is determined that the return process is impossible and thus the return process is not performed (Step S303 in FIG. 3). In this case, the operation of the device is stopped and the state is returned to the normal state manually. For example, an operator opens a panel of the imprint apparatus 1 and visually checks the states of the mold 3, the substrate 5, the mold chuck 10, or the substrate chuck 12. Furthermore, for example, maintenance such as taking the mold 3 or the substrate 5 out of the imprint apparatus 1 may be performed in accordance with the checked state of the mold 3, the substrate 5, or the like. It should be noted that the maintenance work is an example and the present invention is not limited thereto.

Referring again to FIG. 3, when it is determined in Step S302 that only the substrate 5 is detached from the substrate chuck 12, it is determined whether or not the substrate 5 is released from the mold 3 using the detecting unit 14 (Step S304). It should be noted that, here, another detecting unit such as the alignment measurement unit 17 may be used. When it is determined that the substrate 5 is not released from the mold 3 (No), it is determined that the return process is possible and thus the return process is performed (Step S305).

Figure 5A:
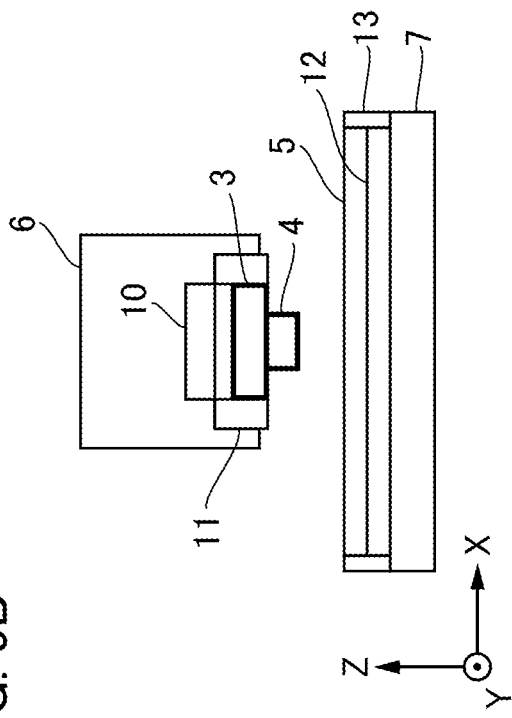
FIGS. 5A to 5D are diagrams for explaining the abnormality of a holding operation in which a return process is possible.

FIGS. 5A to 5D are diagrams for explaining the abnormality of a holding operation in which a return process is possible. FIG. 5A illustrates an example of states of the mold 3 and the substrate 5 subjected to the return process in Step S305. In FIG. 5A, only the substrate 5 is detached from the substrate chuck 12 and the substrate 5 is not released from the mold 3. In the return process performed in such a state, the substrate stage 7 is moved so that the entire surface of the substrate 5 is in a region of the substrate chuck 12. When it is checked that the entire surface of the substrate 5 has entered the region of the substrate chuck 12, the imprint head 6 is moved downward little by little in a direction (a −Z direction) of the substrate chuck 12 and a suction pressure of the substrate chuck 12 is checked. After it is determined that the substrate 5 is correctly suctioned by the substrate chuck 12, the imprint head 6 is moved downward to a predetermined contact position. When the imprint head 6 is driven in a direction (a +Z direction) in which the imprint head 6 is released from the mold without moving the imprint head 6 downward to the contact position (a mold pressing position) even if the suction pressure is correctly adsorbed, the abnormality of the holding operation is likely to occur again due to an insufficient suction pressure. After the imprint head 6 is moved downward to the contact position, the imprint head 6 is pulled up little by little in the direction (the +Z direction) in which the imprint head 6 is released from the mold. When the suction pressure of the mold chuck 10 and the substrate chuck 12 is checked and it is determined that the mold 3 and the substrate 5 are correctly adsorbed together, a restoration operation is completed and it is determined whether or not the restoration has been completed in Step S210 of FIG. 2.

Referring again to FIG. 3, when it is determined in Step S304 that the substrate 5 is released from the mold 3 (Yes), the suction pressure of the substrate chuck 12 is checked again in Step S306. When the suction pressure of the substrate chuck 12 is normal (Yes), it is determined that, once the substrate 5 is detached from the substrate chuck 12, and after that, it is determined that the substrate is correctly adsorbed on the substrate chuck 12, and thus the return process is unnecessary (Step S307). It should be noted that, at this time, the return process is not performed. However, when it is determined that the suction pressure of the substrate chuck 12 is abnormal (No), the substrate 5 is likely to ride on the flush plate 13 or fall from the substrate stage 7. FIG. 4B illustrates an example of states of the mold 3 and the substrate 5 when the suction pressure of the substrate chuck 12 is abnormal. In FIG. 4B, the substrate 5 rides on the flush plate 13. Since there is a concern concerning the substrate 5 being damaged during the return process in such a state, it is determined that the return process is impossible and thus the return process is not performed (Step 308 in FIG. 3). In this case, the operation of the device is stopped and the state is returned to the normal state manually.

Figure 5B:
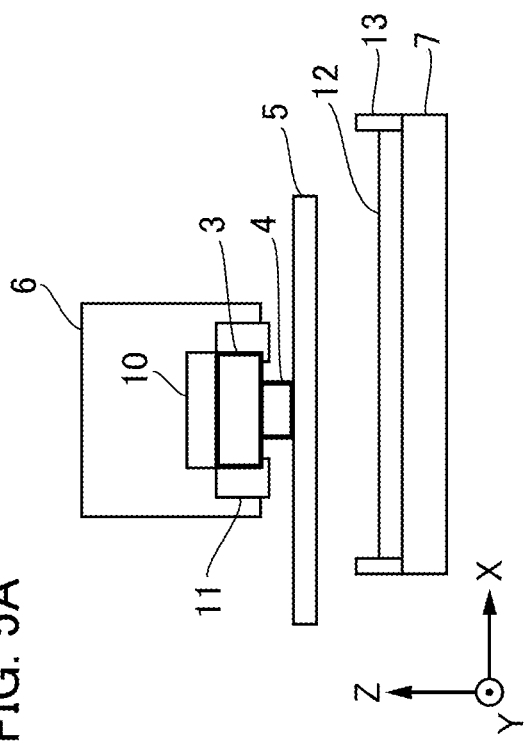

Referring again to FIG. 3, when it is determined in Step S302 that only the mold 3 is detached from the mold chuck 10, either one of the detecting units checks whether or not the mold 3 is in the pressurization finger 11, in other words, the pressurization finger 11 holds the mold 3 (Step S309). When it is determined that the mold 3 is in the pressurization finger 11 (Yes), it is determined that the return process is possible and thus the return process is performed (Step S310). FIG. 5B illustrates an example of states of the mold 3 and the substrate 5 subjected to the return process in Step S310. In FIG. 5B, only the mold 3 is detached from the mold chuck 10 and the mold 3 remains in the pressurization finger 11. In the return process in such a state, the substrate stage 7 is driven in a planar direction so that the mold 3 comes into contact with an arbitrary position such as a region in which a pattern on the substrate is not formed or the like. Subsequently, the imprint head 6 is moved downward little by little in the direction (the −Z direction) of the substrate chuck 12 to a position in which the mold 3 comes into contact with the substrate 5. The suction pressure of the mold chuck 10 is checked by bringing the mold 3 into contact with the substrate 5 and stopping the driving of the imprint head 6 and then the pressurization finger 11 is opened and the imprint head 6 is moved downward little by little again in a state in which the pressurization finger 11 is open. After it is determined that the mold 3 is correctly suctioned by the mold chuck 10 based on the suction pressure of the mold chuck 10, the driving of the imprint head 6 is stopped, the pressurization finger 11 is closed, and the imprint head 6 is pulled up in a direction (the +Z direction) in which the imprint head 6 is released little by little. When the suction pressures of the mold chuck 10 and the substrate chuck 12 are checked and it is determined that both the mold chuck 10 and the substrate chuck 12 are correctly adsorbed, the return process is completed.

Figure 5C:
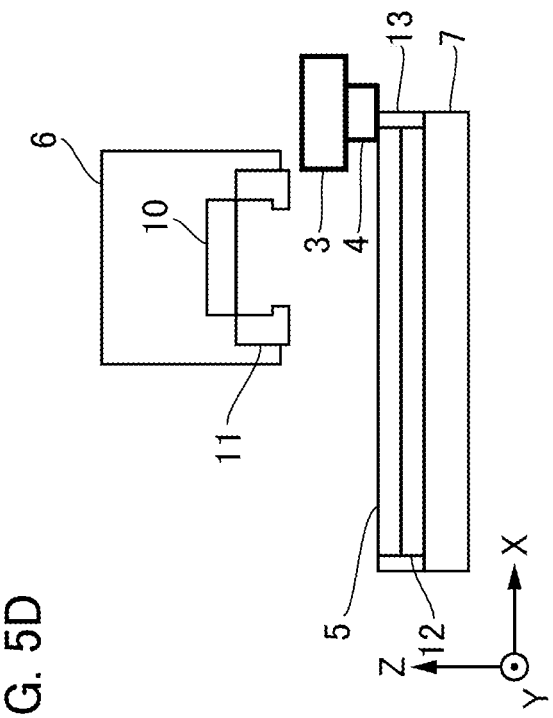

Referring again to FIG. 3, when it is determined in Step S309 that the mold 3 is not in the pressurization finger 11, it is determined whether or not the entire surface of the mold 3 is on the substrate 5 by detecting a current position of the mold 3 using the detecting unit 14 or another detecting unit and (Step S311). When it is determined that the entire surface of the mold 3 is on the substrate 5 (Yes), it is determined that the return process is possible and thus the return process is performed (Step S312). FIG. 5C illustrates an example of states of the mold 3 and the substrate 5 subjected to the return process in Step S312. In FIG. 5C, only the mold 3 is detached from the mold chuck 10 and the entire surface of the mold 3 is located on the substrate 5. In the return process in such a state, the substrate stage 7 is driven so that the imprint head 6 is directly above the mold 3. The suction pressure of the mold chuck 10 is checked by opening the pressurization finger 11 and moving the imprint head 6 downward little by little in a direction (the −Z direction) of the substrate chuck 12 while suctioning is performed using the mold chuck 10. After it is determined that the mold 3 is correctly adsorbed by the mold chuck 10 based on the suction pressure of the mold chuck 10, the pressurization finger 11 is closed and the imprint head 6 is pulled up in a direction (the +Z direction) in which the imprint head 6 is released little by little. When it is determined that both the mold chuck 10 and the substrate chuck 12 are normal by checking the suction pressures of the mold chuck 10 and the substrate chuck 12, the return process is completed.

Figure 5D:
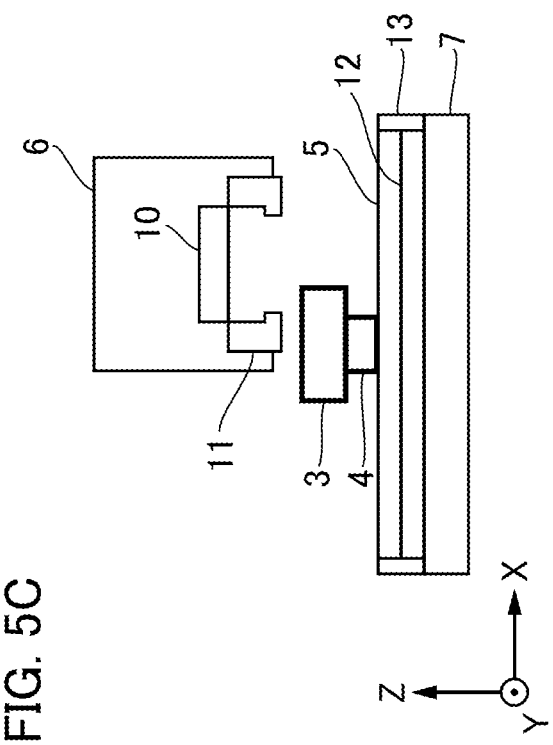

Referring again to FIG. 3, when it is determined in Step S311 that the entire surface of the mold 3 is not on the substrate 5 (No), it is determined whether or not a part of the mold 3 is on the substrate chuck by detecting a current position of the mold 3 using the detecting unit 14 or another detecting unit (Step S313). When it is determined that a part of the mold 3 is on the substrate chuck 12 (Yes), it is determined that the return process is possible and the return process is performed (Step S314). FIG. 5D illustrates an example of states of the mold 3 and the substrate 5 subjected to the return process in Step S314. In FIG. 5D, only the mold 3 is detached from the mold chuck 10 and a part of the mold 3 is located on the substrate 5. In the return process in such a state, the substrate stage 7 is slowly driven so that the imprint head 6 is directly over the mold 3. The pressurization finger 11 is opened and the imprint head 6 is moved downward in a direction (the −Z direction) of the substrate chuck 12 little by little. After the imprint head 6 is moved downward to a position in which the mold 3 is present, the pressurization finger 11 is closed and the imprint head 6 is driven little by little to a position in which the mold 3 is separated from the substrate chuck 12. Subsequently, the substrate stage 7 is driven in a planar direction so that the mold 3 comes into contact with any position such as a region in which a pattern of the substrate 5 is not formed. After that, the imprint head 6 is moved downward little by little to a position in which the mold 3 comes into contact with the substrate 5 in a direction (the −Z direction) of the substrate chuck 12. After the mold 3 comes into contact with the substrate 5 and the driving of the imprint head 6 is stopped, the pressurization finger 11 is opened and the suction pressure of the mold chuck 10 is checked by moving the imprint head 6 downward again in a state in which the pressurization finger 11 is opened. After it is determined that the mold 3 is correctly adsorbed by the mold chuck 10 based on the suction pressure of the mold chuck 10, the driving of the imprint head 6 is stopped. The pressurization finger 11 is closed and the imprint head 6 is moved upward little by little. When it is determined that both the mold chuck 10 and the substrate chuck 12 are normal by checking the suction pressures of the mold chuck 10 and the substrate chuck 12, the return process is completed.

Referring again to FIG. 3, when it is determined in Step S313 that a part of the mold 3 is not on the substrate chuck 12, it is conceivable that the mold 3 has fallen from the substrate stage 7. FIG. 4C illustrates an example of states of the mold 3 and the substrate 5 when it is determined in Step S313 that a part of the mold is not on the substrate chuck 12. Since there is a concern concerning the mold 3 being damaged during the return process in such a state, it is determined that the return process is impossible and thus the return process is not performed (Step S315). In this case, the operation of the device is stopped and the state is returned to the normal state manually.

It should be noted that, when it is determined that the state has been returned to the normal state in the determination after the return process concerning whether or not the state has been returned to the normal state (Step S210 in FIG. 2), it may be possible to select restarting using the same material or to restart only a material causing the abnormality of the holding operation after replacement. Furthermore, it may be possible to perform restarting after all materials at the time of abnormality occurrence of a holding operation are replaced.

Also, normally, when the imprint apparatus 1 is reset, initial position driving in which the imprint apparatus 1 is driven to an initial position of the substrate stage 7 or the imprint head 6 in the reset process is started. In a case in which the return process is not performed, when the imprint apparatus 1 is reset before returning to the normal state manually, the substrate stage 7 and the imprint head 6 are likely to interfere with the mold 3 or the substrate 5 detached from the chuck due to the initial position driving. Thus, In the reset process after it is determined that the return process is not to be performed, the initial position driving of the substrate stage 7 and the imprint head 6 may not be performed. By adopting such a configuration, it is possible to reduce the breakage of a material when the device is erroneously reset despite the fact that the return process is not performed.

Also, when the power supply is turned on, the substrate stage 7 is floated on the base surface plate 18 using the air guide 19 and the position of the substrate stage 7 is controlled. However, when the power supply is turned off, the position of the substrate stage 7 is not controlled and the air guide 19 does not stop immediately. For this reason, the mold 3 or the substrate 5 detached from the chuck is likely to interfere with the substrate stage 7 due to the air guide 19. Therefore, when the power supply is turned off after it is determined that the return process is impossible, in order to prevent the substrate stage 7 from moving, when the power supply is turned off, the air guide 19 may be stopped and the substrate stage 7 may be moved downward onto the base surface plate 18.

It should be noted that, although the mold holding force measuring unit 15, the substrate holding force measuring unit 16, and the alignment measurement unit 17 are used as a part of the detecting unit in this embodiment, the detecting unit 14 may be provided in addition to these. Furthermore, although the detecting unit 14 is provided in this embodiment, the detecting unit 14 may not be separately provided using the members, such as the mold holding force measuring unit 15, the substrate holding force measuring unit 16, and the alignment measurement unit 17, capable of observing or monitoring the mold 3 and the substrate 5. With such a configuration, cost can be reduced. Moreover, when a scope and a laser interferometer are used as a detecting unit, the scope and the laser interferometer may be configured to be drivable. With such a configuration, a range which can be detected is broadened by one detecting unit and the number of detecting units installed can be reduced.

Embodiment of Article Manufacturing Method

A method for manufacturing an article according to the embodiment of the present invention is appropriate for manufacturing, for example, an article such as a microdevice such as a semiconductor device and an element having a fine structure. The method for manufacturing an article in this embodiment includes a step of forming a pattern on an imprint material applied on a substrate using the imprint apparatus (a step of performing an imprint process on the substrate) and a step of processing the substrate having the pattern formed in such a step thereon. Furthermore, such a manufacturing method includes other well-known steps (oxidation, film formation, vapor deposition, doping, planarization, etching, resist peeling, dicing, bonding, packaging, and the like). The method for manufacturing an article in this embodiment is advantageous in at least one of performance, quality, productivity, and production cost of an article, as compared with the conventional method.

The pattern made of the cured material formed using the imprint apparatus 1 is used permanently in at least some of various articles or temporarily when various articles are manufactured. An article is an electric circuit element, an optical element, an MEMS, a recording element, a sensor, a mold, or the like. Examples of the electric circuit elements include volatile or nonvolatile semiconductor memories such as a DRAM, an SRAM, a flash memory, and an MRAM and semiconductor elements such as an LSI, a CCD, an image sensor, and an FPGA. Examples of the mold include an imprinting mold and the like.

The pattern made of the cured material is used as it is as a constituent member of at least some of the above-described articles or is temporarily used as a resist mask. After etching, ion implantation, or the like is performed in the step of processing the substrate, the resist mask is removed.

Figure 6A:
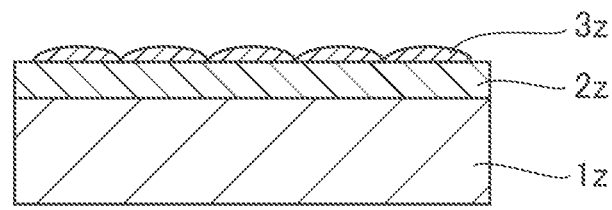
FIGS. 6A to 6F are diagrams illustrating a method for manufacturing an article.

The method of manufacturing an article will be described in detail below. As illustrated in FIG. 6A, a substrate 1z such as a silicon wafer having a surface on which a workpiece 2z such as an insulator is formed is prepared and then the imprint material 3z is applied to the surface of the workpiece 2z using an inkjet method or the like. Here, a state in which a plurality of droplet-shaped imprint materials 3z are applied on the substrate is illustrated.

Figure 6B:
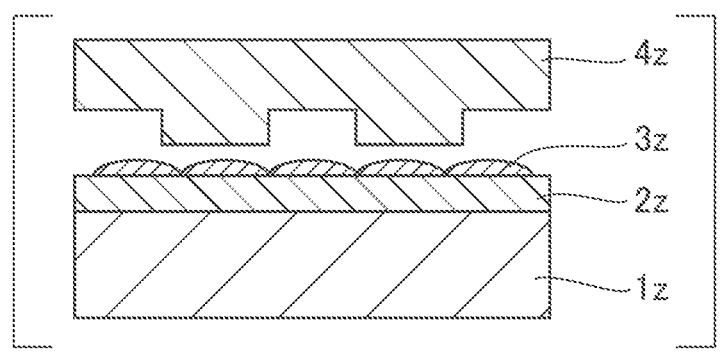
Figure 6C:
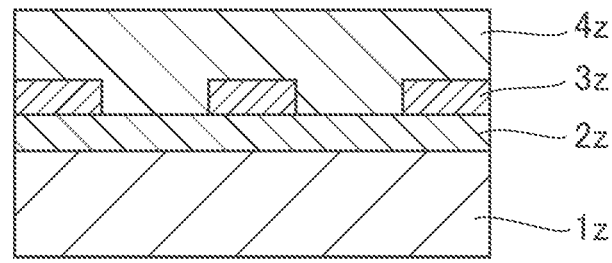

As illustrated in FIG. 6B, an imprinting mold 4z faces so that a side of an imprinting mold 4z on which a concave and convex pattern thereof is formed faces the imprint material 3z on the substrate. As illustrated in FIG. 6C, the substrate 1z to which the imprint material 3z is applied is brought into contact with the mold 4z and subjected to pressure. A gap between the mold 4z and the workpiece 2z is filled with the imprint material 3z. In this state, when the imprint material 3z is irradiated with light to transmit the mold 4z as curing energy, the imprint material 3z is cured.

Figure 6D:
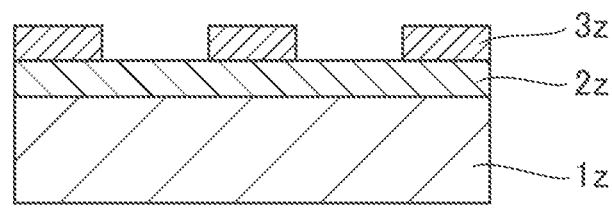

As illustrated in FIG. 6D, when the imprint material 3z is cured and then the mold 4z and the substrate 1z are separated from each other, a pattern made of the cured material of the imprint material 3z is formed on the substrate 1z. This pattern made of the cured material is formed so that a convex portion of the mold corresponds to a concave portion of the cured material and a concave portion of the mold corresponds to a convex portion of the cured material, that is, a concave and convex pattern of the mold 4z is transferred to the imprint material 3z.

Figure 6E:
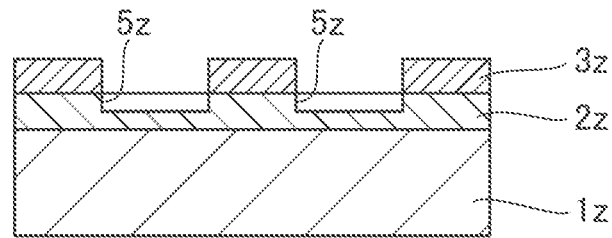
Figure 6F:
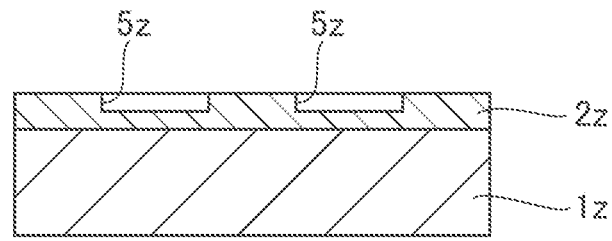

As illustrated in FIG. 6E, when etching is performed using a pattern made of the cured material as an etching-resistant mask, grooves 5z are formed by removing a portion of a surface of the workpiece 2z in which the cured material is not present or a thin residual portion. As illustrated in FIG. 6F, when the pattern made of the cured material is removed, an article having the grooves 5z formed in a surface of the workpiece 2z can be obtained. Here, the pattern made of the cured material is removed, but may be used as, for example, a film for interlayer insulation included in a semiconductor element, that is, as a constituent member of an article, without removing the pattern also after processing.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-093966, filed May 15, 2018, which is hereby incorporated by reference wherein in its entirety.

What is claimed is:

1. An imprint apparatus which brings an imprint material on a substrate into contact with a mold and forms a pattern made of the imprint material, comprising:
    a mold holding unit configured to hold the mold;
    a substrate holding unit configured to hold the substrate;
    a detecting unit configured to detect an occurrence of desorption of the mold from the mold holding unit, an occurrence of desorption of the substrate from the substrate holding unit, and a position of the mold and the substrate; and
    a controller configured to
        i) perform determination of whether an abnormal state has occurred, including the determining of the occurrence of desorption of the mold and the occurrence of desorption of the substrate based on a detection of the detecting unit;
        ii) in a case that it has been determined that the abnormal state has occurred, perform a determination concerning whether or not it is possible to perform a return process without damage to the mold or substrate in which a state in which the abnormal state has occurred to a normal state, wherein the determination concerning whether or not it is possible to perform the return process without damage to the mold or substrate is made on a basis of a detection result of which of the mold holding unit and the substrate holding unit is in abnormal state and the position of the mold and the substrate detected by the detecting unit when the abnormal state occurs; and
        iii) execute the return process in a case that it is determined that it is possible to perform the return process without damage to the mold or substrate,
    wherein the detection of the position of the mold and the substrate is performed by using an alignment detector which performs measurement for alignment between the mold and the substrate as a part of the detecting unit.

2. The imprint apparatus according to claim 1, wherein the detecting unit is a second measuring unit which measures a holding force of the mold using the mold holding unit or a holding force of the substrate using the substrate holding unit, in which:
    the second measuring unit detects an occurrence of the abnormal state in the mold holding unit or the substrate holding unit on the basis of the measured holding force.

3. The imprint apparatus according to claim 1, wherein the detecting unit detects a releasing between the mold and the substrate.

4. The imprint apparatus according to claim 1, wherein the detecting unit detects a position of the mold or the substrate on the basis of a movement of the mold holding unit or the substrate holding unit.

5. The imprint apparatus according to claim 1, wherein the controller performs at least one of the determination concerning whether or not the return process without damage to the mold or substrate is possible and an execution of the return process on the basis of the position of the mold or the substrate detected by the detecting unit.

6. The imprint apparatus according to claim 1, wherein the controller moves the substrate holding unit to perform the return process.

7. The imprint apparatus according to claim 1, wherein the controller moves the mold holding unit to perform the return process.

8. The imprint apparatus according to claim 7, wherein the mold holding unit includes a contact member which comes into contact with a lateral surface of the mold and
    the controller drives the contact member to perform the return process.

9. The imprint apparatus according to claim 1, wherein the controller does not perform initial position driving in a reset process of the imprint apparatus when it is determined that the return process is impossible.

10. The imprint apparatus according to claim 1, comprising:
    an air guide which forms a gap between a substrate stage configured to hold the substrate holding unit and a surface plate and supports the stage,
    wherein, in a case in which it is determined that the return process without damage to the mold or substrate is impossible, the controller stops the air guide when a power supply of the imprint apparatus is turned off.

11. The imprint apparatus according to claim 1, wherein the controller performs the return process of moving the substrate holding unit and the mold holding unit when the detecting unit detects that the substrate is detached from the substrate holding unit and that the mold is not released from the substrate.

12. The imprint apparatus according to claim 1, wherein the return process includes moving the substrate holding unit and the mold holding unit, and the controller performs the return process when the detecting unit detects that the mold is detached from a finger of the mold holding unit and that the mold is held by a contact member which comes into contact with a lateral surface of the mold included in the mold holding unit.

13. The imprint apparatus according to claim 1, wherein the return process includes moving the substrate holding unit and the mold holding unit, and the controller performs the return process when the detecting unit detects that the mold is detached from the mold holding unit and that the entire surface of the mold is located on the substrate held by the substrate holding unit.

14. The imprint apparatus according to claim 1, wherein the return process includes moving the substrate holding unit and the mold holding unit, and the controller performs the return process when the detecting unit detects that the mold is detached from the mold holding unit and that a part of the mold is located on a substrate chuck included in the substrate holding unit.

15. The imprint apparatus according to claim 1, wherein the detecting unit is a scope or an interferometer which is able to be driven.

16. The imprint apparatus according to claim 1, wherein the detecting unit detects a position of the mold with respect to the mold holding unit or a position of the substrate with respect to the substrate holding unit when the abnormal state occurs as the position of the mold or the substrate when the abnormal state occurs.

17. An imprint method for bringing an imprint material on a substrate into contact with a mold and forming a pattern of the imprint material, comprising:
   detecting an occurrence of desorption of the mold from a mold holding unit, an occurrence of desorption of the substrate from a substrate holding unit, and a position of the mold and the substrate;
   i) performing determination of whether an abnormal state has occurred, including the determining of the occurrence of desorption of the mold and the occurrence of desorption of the substrate based on a detection of the detecting unit;
   ii) in a case that it has been determined that the abnormal state has occurred, performing a determination concerning whether or not it is possible to perform a return process without damage to the mold or substrate in which a state in which the abnormal state has occurred to a normal state, wherein the determination concerning whether or not it is possible to perform the return process without damage to the mold or substrate is made on a basis of a detection result of which of the mold holding unit and the substrate holding unit is in abnormal state and the position of the mold and the substrate detected by the detecting unit when the abnormal state occurs; and
   iii) executing the return process in a case that it is determined that it is possible to successfully perform the return process without damage to the mold or substrate,
   wherein the detection of the position of the mold and the substrate is performed by using an alignment detector which performs measurement for alignment between the mold and the substrate as a part of the detecting.

18. A method for manufacturing an article, comprising: forming, by an imprint apparatus configured to bring an imprint material on a substrate into contact with a mold and form a pattern made of the imprint material on the substrate, the pattern on the substrate; and
   processing the substrate having the pattern formed thereon,
   wherein the imprint apparatus includes:
   a mold holding unit which holds the mold;
   a substrate holding unit which holds the substrate;
   a detecting unit configured to detect an occurrence of desorption of the mold from the mold holding unit, an occurrence of desorption of the substrate from the substrate holding unit and the substrate holding unit has an abnormal state in a holding operation, and a position of the mold and the substrate;
   a controller configured to
   i) perform determination of whether the abnormal state has occurred, including the determining of the occurrence of desorption of the mold and the occurrence of desorption of the substrate based on a detection of the detecting unit;
   ii) in a case that it has been determined that the abnormal state has occurred, perform a determination concerning whether or not it is possible to perform a return process without damage to the mold or substrate in which a state in which the abnormal state has occurred to a normal state, wherein the determination concerning whether or not it is possible to perform the return process without damage to the mold or substrate is made on a basis of a detection result of which of the mold holding unit and the substrate holding unit is in abnormal state and the position of the mold and the substrate detected by the detecting unit when the abnormal state occurs; and
   iii) execute the return process in a case that it is determined that it is possible to successfully perform the return process without damage to the mold or substrate,
   wherein the detection of the position of the mold and the substrate is performed by using an alignment detector which performs measurement for alignment between the mold and the substrate as a part of the detecting unit.

* * * * *